(12) United States Patent
Yoon et al.

(10) Patent No.: US 9,634,112 B2
(45) Date of Patent: Apr. 25, 2017

(54) FIELD EFFECT TRANSISTOR AND METHOD OF FABRICATING THE SAME

(71) Applicant: ELECTRONICS AND TELECOMMUNICATIONS RESEARCH INSTITUTE, Daejeon (KR)

(72) Inventors: Hyung Sup Yoon, Daejeon (KR); Byoung-Gue Min, Daejeon (KR); Jong-Won Lim, Daejeon (KR); Hokyun Ahn, Daejeon (KR); Seong-Il Kim, Daejeon (KR); Sang Heung Lee, Daejeon (KR); Dong Min Kang, Daejeon (KR); Chull Won Ju, Daejeon (KR); Jae Kyoung Mun, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 0 days.

(21) Appl. No.: 14/633,984

(22) Filed: Feb. 27, 2015

(65) Prior Publication Data

US 2015/0171188 A1 Jun. 18, 2015

Related U.S. Application Data

(62) Division of application No. 13/935,096, filed on Jul. 3, 2013, now abandoned.

(30) Foreign Application Priority Data

Dec. 12, 2012 (KR) .................. 10-2012-0144126

(51) Int. Cl.
*H01L 29/66* (2006.01)
*H01L 29/778* (2006.01)
(Continued)

(52) U.S. Cl.
CPC .... *H01L 29/66462* (2013.01); *H01L 21/0217* (2013.01); *H01L 21/0254* (2013.01);
(Continued)

(58) Field of Classification Search
CPC ............. H01L 29/2003; H01L 29/7787; H01L 21/8252
(Continued)

(56) References Cited

U.S. PATENT DOCUMENTS 6,159,861 A * 12/2000 Asai .................. H01L 21/28581
257/E21.173
6,204,102 B1 * 3/2001 Yoon ...................... B82Y 10/00
257/E21.408
(Continued)

FOREIGN PATENT DOCUMENTS

JP 63-015475 A 1/1988
JP 63-193570 A 8/1988
(Continued)

OTHER PUBLICATIONS

Chia-Ta Chang et al., "30-GHz Low-Noise Performance of 100-nm-Gate-Recessed n-GaN/AlGaN/GaN HEMTs", IEEE Electron Device Letters, Feb. 2010, pp. 105-107, vol. 31, No. 2.
(Continued)

*Primary Examiner* — Cuong Q Nguyen
*Assistant Examiner* — Nishath Yasmeen
(74) *Attorney, Agent, or Firm* — Rabin & Berdo, P.C.

(57) ABSTRACT

A field effect transistor is provided. The field effect transistor may include a capping layer on a substrate, a source ohmic electrode and a drain ohmic electrode on the capping layer, a first insulating layer and a second insulating layer stacked on the capping layer to cover the source and drain ohmic electrodes, a Γ-shaped gate electrode including a leg portion and a head portion, the leg portion being connected to the
(Continued)

substrate between the source ohmic electrode and the drain ohmic electrode, and the head portion extending from the leg portion to cover a top surface of the second insulating layer, a first planarization layer on the second insulating layer to cover the Γ-shaped gate electrode, and a first electrode on the first planarization layer, the first electrode being connected to the source ohmic electrode or the drain ohmic electrode.

11 Claims, 5 Drawing Sheets

(51) Int. Cl.
    *H01L 29/40* (2006.01)
    *H01L 29/423* (2006.01)
    *H01L 29/20* (2006.01)
    *H01L 21/02* (2006.01)
    *H01L 21/28* (2006.01)
    *H01L 21/311* (2006.01)
    *H01L 29/201* (2006.01)
    *H01L 29/205* (2006.01)
    *H01L 21/285* (2006.01)

(52) U.S. Cl.
    CPC .. *H01L 21/02118* (2013.01); *H01L 21/02178* (2013.01); *H01L 21/28264* (2013.01); *H01L 21/31111* (2013.01); *H01L 21/31144* (2013.01); *H01L 29/201* (2013.01); *H01L 29/2003* (2013.01); *H01L 29/205* (2013.01); *H01L 29/404* (2013.01); *H01L 29/42316* (2013.01); *H01L 29/42376* (2013.01); *H01L 29/778* (2013.01); *H01L 29/7786* (2013.01); *H01L 21/28593* (2013.01)

(58) Field of Classification Search
    USPC .................................. 257/194, 758; 438/182
    See application file for complete search history.

(56) References Cited

U.S. PATENT DOCUMENTS

| | | | |
|---|---|---|---|
| 7,064,439 B1* | 6/2006 | Berthold | H01L 21/76829 257/750 |
| 8,518,794 B2 | 8/2013 | Ahn et al. | |
| 2008/0087916 A1 | 4/2008 | Amasuga et al. | |
| 2008/0277692 A1* | 11/2008 | Saito | H01L 29/778 257/192 |
| 2010/0327322 A1* | 12/2010 | Kub | H01L 29/0847 257/194 |
| 2011/0057237 A1* | 3/2011 | Ahn | H01L 29/66863 257/288 |
| 2011/0147762 A1* | 6/2011 | Sheppard | H01L 21/8213 257/76 |
| 2011/0263102 A1 | 10/2011 | Heikman et al. | |

FOREIGN PATENT DOCUMENTS

| | | | |
|---|---|---|---|
| JP | 2007-242746 A | | 9/2007 |
| JP | 2007242746 A | * | 9/2007 |
| KR | 2011-0025500 A | | 3/2011 |

OTHER PUBLICATIONS

Gang Xie et al., "Breakdown-Voltage-Enhancement Technique for FR-Based AlGaN/GaN HEMTs With a Source-Connected Air-Bridge Field Plate", IEEE Electron Device Letters, May 2012, pp. 670-672, vol. 33, No. 5.

Hanyu I. et al., "Super Low-Noise HEMTs With a T-Shaped WSix Gate", Electronics Letters, Oct. 13, 1988, pp. 1327-1328, vol. 24, No. 21.

* cited by examiner

FIELD EFFECT TRANSISTOR AND METHOD OF FABRICATING THE SAME

CROSS-REFERENCE TO RELATED APPLICATIONS

This application is a division of U.S. application Ser. No. 13/935,096, filed on Jul. 3, 2013. U.S. application Ser. No. 13/935,096 claims priority under 35 U.S.C. §119 to Korean Patent Application No. 10-2012-0144126, filed on Dec. 12, 2012, in the Korean Intellectual Property Office. Each of identified applications is incorporated in its entirety herein by reference.

BACKGROUND OF THE INVENTION

Example embodiments of the inventive concept relate to a field effect transistor and a method of fabricating the same, and in particular, to a high-voltage field effect transistor and a method of fabricating the same.

A high electron mobility transistor (HEMT), one of compound semiconductor devices, is configured to include one or more layers having very different lattice constants from other layers and thereby its channel layer can have a modified property. Such a lattice mismatch is used to produce a stress improving electron mobility of the channel layer, in the HEMT devices.

There is a difficulty in growing a substrate for the HEMT. For all that, the HEMT can have improved characteristics of power and noise, due to the increase of charge density and high electron mobility in the channel layer, and thus, it can be operated at a higher frequency. Since the HEMT is superior to silicon-based devices in terms of electron mobility, it is widely used for microwave and millimeter-wave applications.

Gallium nitride (GaN), one of nitride semiconductors, is a direct transition semiconductor with a high electron speed of about $2\times10^7$ cm/s and a high breakdown electric field of about $3\times10^6$ V/cm, and thus, there is an increasing interest in the use of GaN as a new material for high frequency devices. The nitride semiconductors makes it possible to realize as a heterojunction structure, such as AlGaN/GaN, and can be selectively doped, and thus, the use of nitride semiconductor makes it possible to realize a high speed device. In addition, the nitride semiconductor can improve significantly a trade-off relationship between a cutoff frequency (ft) and a breakdown voltage ($V_{BV}$), which is one of technical issues of conventional field effect transistors. Accordingly, the use of the nitride semiconductor makes it possible to realize electronic devices with high voltage and high frequency property.

By using the nitride-semiconductor-based FET, it is possible to simplify or remove a peripheral circuit, such as a power distribution/synthesis circuit and a direct current (DC) converting circuit, and thereby to realize a high power amplifier module with high power efficiency.

Additionally, to realize better modulating operations and reduced noise characteristics, a T-, Y-, or mushroom-shaped gate electrode having an increased sectional area is used for a high speed semiconductor device. The T-, Y-, or mushroom-shaped gate electrode is generally formed using an E-beam lithography or photolithography process.

SUMMARY

Example embodiments of the inventive concept provide a field effect transistor including a Γ-shaped gate electrode capable of improving characteristics of stability, parasitic capacitance, parasitic resistance, and cut-off frequency of the transistor.

Other example embodiments of the inventive concept provide a method of fabricating a field effect transistor with a Γ-shaped gate electrode that is formed to be able to improve characteristics of stability, parasitic capacitance, parasitic resistance, and cut-off frequency of the transistor.

According to example embodiments of the inventive concepts, a field effect transistor may include a capping layer disposed on a substrate, a source ohmic electrode and a drain ohmic electrode disposed, spaced apart from each other, on the capping layer, a first insulating layer and a second insulating layer sequentially stacked on the capping layer to cover the source and drain ohmic electrodes, a Γ-shaped gate electrode including a leg portion and a head portion, the leg portion being connected to the substrate between the source ohmic electrode and the drain ohmic electrode through the second insulating layer, the first insulating layer and the capping layer, and the head portion extending from the leg portion to cover a top surface of the second insulating layer, a first planarization layer provided on the second insulating layer to cover the Γ-shaped gate electrode, and a first electrode provided on the first planarization layer and connected to the source ohmic electrode or the drain ohmic electrode through the first planarization layer, the second insulating layer, and the first insulating layer.

In example embodiments, the capping layer defines an undercut region formed adjacent to the leg portion of the Γ-shaped gate electrode.

In example embodiments, the capping layer may include undoped gallium nitride.

In example embodiments, the leg portion of the Γ-shaped gate electrode has a section shaped like a letter 'Y'.

In example embodiments, the substrate may include a silicon carbide substrate, an aluminum nitride buffer layer, an undoped gallium nitride channel layer, an undoped aluminum gallium nitride spacer layer, and an undoped aluminum gallium nitride Schottky layer that may be sequentially stacked.

In example embodiments, the first insulating layer may include alumina, and the second insulating layer may include silicon nitride.

In example embodiments, the first planarization layer may include benzocyclobutene.

In example embodiments, the field effect transistor may further include at least one second planarization layer provided on the first planarization layer to cover the first electrode, and a second electrode provided on the second planarization layer and connected to the first electrode through the second planarization layer.

In example embodiments, the field effect transistor may further include a protection layer provided on the second planarization layer to cover the second electrode.

According to example embodiments of the inventive concepts, a method of fabricating a field effect transistor may include forming a capping layer on a substrate, forming a source ohmic electrode and a drain ohmic electrode on the capping layer to be spaced apart from each other, sequentially forming a first insulating layer and a second insulating layer on the capping layer to cover the source and drain electrodes, forming a photoresist layer with a first opening exposing a portion of the second insulating layer between the source and drain ohmic electrodes, partially etching the second and first insulating layers using the photoresist layer as an etch mask to define a second opening, removing the photoresist layer, partially etching the capping layer using the first and second insulating layers defining the second opening as an etch mask to form a third opening partially exposing the substrate, forming a Γ-shaped gate electrode with a leg portion connected to the substrate through the third opening and a head portion covering a top surface of the second insulating layer, forming a first planarization layer on the second insulating layer to cover the Γ-shaped gate electrode, and forming a first electrode on the first planarization layer, the first electrode being connected to the source ohmic electrode or the drain ohmic electrode through the first planarization layer, the second insulating layer, and the first insulating layer.

In example embodiments, the capping layer may be formed of undoped gallium nitride.

In example embodiments, the first insulating layer may be formed of alumina and the second insulating layer may be formed of silicon nitride.

In example embodiments, the defining of the second opening may include partially etching the second and first insulating layers using the photoresist layer as an etch mask to form a preliminary second opening having substantially the same width as that of the first opening, and selectively etching the second insulating layer to define a Y-shaped second opening.

In example embodiments, the defining of the third opening may include etching a portion of the capping layer using the first and second insulating layers with the second opening as an etch mask, and the capping layer may be formed to define an undercut region, whose width may be greater than that of the first opening.

In example embodiments, the leg portion of the Γ-shaped gate electrode may be formed spaced apart from the capping layer, and thereby the third opening may be not filled with the leg portion.

In example embodiments, the substrate may be a stack of a silicon carbide substrate, an aluminum nitride buffer layer, an undoped gallium nitride channel layer, an undoped aluminum gallium nitride spacer layer, and an undoped aluminum gallium nitride Schottky layer that may be sequentially stacked.

In example embodiments, the first planarization layer may be formed of benzocyclobutene.

In example embodiments, the forming of the Γ-shaped gate electrode may include forming a photoresist mold layer on the second insulating layer to define a fourth opening, whose width may be greater than those of the first to third openings, forming conductive layers in the third and fourth openings and on the photoresist mold layer, and removing the photoresist mold layer and the conductive layer on the photoresist mold layer.

In example embodiments, the method may further include forming at least one second planarization layer on the first planarization layer to cover the first electrode, and forming a second electrode on the second planarization layer, the second electrode being connected to the first electrode through the second planarization layer.

In example embodiments, the method may further include forming a protection layer on the second planarization layer to cover the second electrode.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
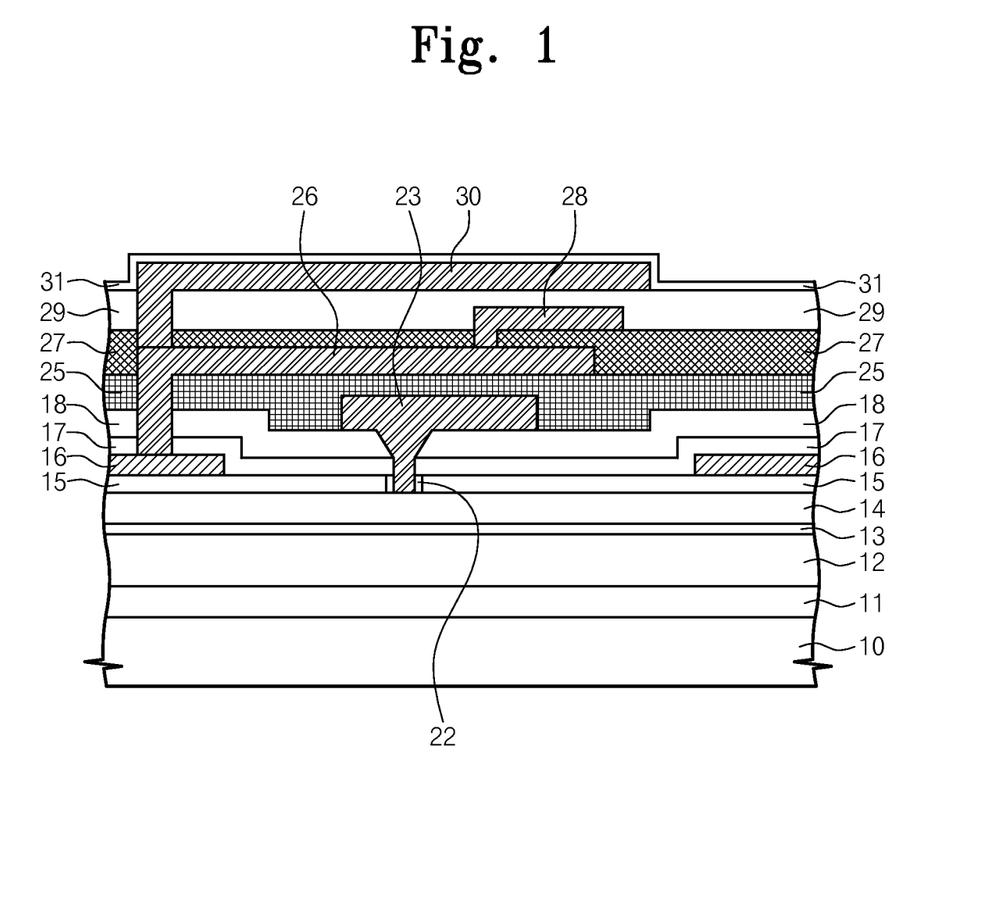
FIG. 1 is a sectional view illustrating a field effect transistor according to example embodiments of the inventive concept.

FIG. 1 is a sectional view illustrating a field effect transistor according to example embodiments of the inventive concept.

Referring to FIG. 1, a field effect transistor may include a substrate, a capping layer 15, source and drain ohmic electrodes 16, first and second insulating layers 17 and 18, a Γ-shaped gate electrode 23, first, second, and third planarization layers 25, 27 and 29, first, second, and third electrodes 26, 28, and 30, and a protection layer 31.

The substrate may include a silicon carbide (SiC) substrate 10, an aluminum nitride (AlN) buffer layer 11, an undoped gallium nitride (GaN) channel layer 12, an undoped aluminum gallium nitride (AlGaN) spacer layer 13, and an undoped aluminum gallium nitride Schottky layer 14, which may be sequentially stacked.

The capping layer 15 may be provided on the Schottky layer 14 of the substrate. The capping layer 15 may include undoped gallium nitride.

The source and drain ohmic electrodes 16 may be provided spaced apart from each other on the capping layer 15. The source and drain ohmic electrodes 16 may include a conductive material. For example, the source and drain ohmic electrodes 16 may include an alloy, which may be formed by performing a rapid thermal annealing process to a stack of titanium/aluminum/nickel/gold or of titanium/aluminum/nickel/palladium/gold.

The first insulating layer 17 and the second insulating layer 18 may be sequentially stacked on the capping layer 15 to cover the source and drain ohmic electrodes 16. The first insulating layer 17 may include alumina ($Al_2O_3$), and the second insulating layer 18 may include silicon nitride (SiN).

The Γ-shaped gate electrode 23 may include a leg portion, which penetrates the second insulating layer 18, the first insulating layer 17, and the capping layer 15 and is connected to a portion of the substrate between the source and drain ohmic electrodes 16, and a head portion extending to cover partially a top surface of the second insulating layer 18. The Γ-shaped gate electrode 23 may include a heat-resisting metal. The Γ-shaped gate electrode 23 may be a multi-layered structure of nickel/gold or platinum/nickel/tungsten nitride/gold. The head portion of the Γ-shaped gate electrode 23 may extend horizontally from the leg portion in an asymmetric manner. A length of the head portion extending toward the drain ohmic electrode 16 may be greater than that toward the source ohmic electrode 16. The leg portion of the Γ-shaped gate electrode 23 may be shaped like a letter 'Y'. In example embodiments, the capping layer 15 may be formed to define an undercut region 22 adjacent to the leg portion of Γ-shaped gate electrode 23.

The first planarization layer 25 may be provided on the second insulating layer 18 to cover the Γ-shaped gate electrode 23. The first planarization layer 25 may include a low-k dielectric material, e.g., BenzoCycloButene (BCB).

The first electrode 26 may be connected to the source ohmic electrode 16 or the drain ohmic electrode 16 through the first planarization layer 25, the second insulating layer 18, and the first insulating layer 17. In example embodiments, the first electrode 26 may include a portion covering a top surface of the first planarization layer 25. The first electrode 26 may include a conductive material.

The second planarization layer 27 may be provided on the first planarization layer 25 to cover the first electrode 26. The second electrode 28 may be connected to the first electrode 26 through the second planarization layer 27. In example embodiments, the second electrode 28 may include a portion covering a top surface of the second planarization layer 27. A third planarization layer 29 may be provided on the second planarization layer 27 to cover the second electrode 28. The third electrode 30 may be connected to the first electrode 26 through the third planarization layer 29 and the second planarization layer 27. In example embodiments, the third electrode 30 may include a portion covering a top surface of the third planarization layer 29. Each of the second and third planarization layers 27 and 29 may include a low-k dielectric material, for example, BCB. Each of the second and third electrodes 28 and 30 may include a conductive material.

The protection layer 31 may be provided on the third planarization layer 29 to cover the third electrode 30. The protection layer 31 may include silicon nitride.

According to example embodiments of the inventive concept, the field effect transistor may include the Γ-shaped gate electrode that may be formed by using an double-layered structure of insulating layers having different etch rates from each other, and thus, it is possible to improve stability of the Γ-shaped gate electrode and maintain a small width of the leg portion of the Γ-shaped gate electrode. Further, since the field effect transistor includes an insulating layer provided between the head portion of the Γ-shaped gate electrode and the substrate, it is possible to improve a drain output property and reduce parasitic capacitance between the Γ-shaped gate electrode and the source ohmic electrode and between the Γ-shaped gate electrode and the drain ohmic electrode. Furthermore, since the Γ-shaped gate electrode of the field effect transistor has a reduced length, it is possible to improve a cutoff frequency property and a high frequency property. As a result, it is possible to provide a field effect transistor with improved stability, reduced parasitic capacitance, and high frequency property.

FIGS. 2A through 2G are sectional views illustrating a method of fabricating a field effect transistor, according to example embodiments of the inventive concept.

Figure 2A:
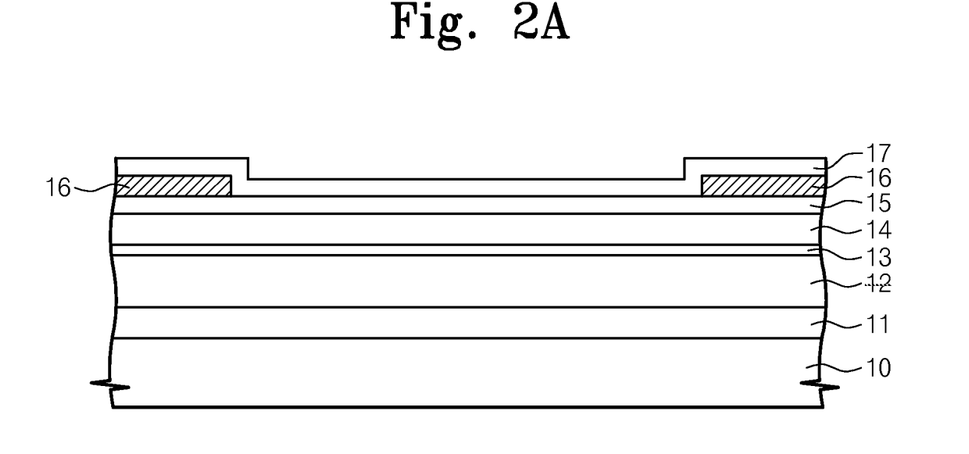
FIGS. 2A through 2G are sectional views illustrating a method of fabricating a field effect transistor, according to example embodiments of the inventive concept.

Referring to FIG. 2A, a capping layer 15 may be formed on a substrate. The substrate may include a silicon carbide substrate 10, an aluminum nitride buffer layer 11, an undoped gallium nitride channel layer 12, an undoped aluminum gallium nitride spacer layer 13, and an undoped aluminum gallium nitride Schottky layer 14, which may be sequentially stacked. The capping layer 15 may be formed of undoped gallium nitride.

A source ohmic electrode 16 and a drain ohmic electrode 16 may be formed on the capping layer 15 to be spaced apart from each other. The source and drain ohmic electrodes 16 may be formed of a conductive material. For example, the source and drain ohmic electrodes 16 may be formed of an alloy, which may be formed by performing a rapid thermal annealing process to a stack of titanium/aluminum/nickel/gold or of titanium/aluminum/nickel/palladium/gold. The rapid thermal annealing process may be performed at a temperature of about 850° C.

A first insulating layer 17 may be formed on the capping layer 15 to cover the source and drain ohmic electrodes 16. The first insulating layer 17 may be formed of alumina. The first insulating layer 17 may be formed using an atomic layer deposition (ALD) to have a thickness of about 500 Å.

Figure 2B:
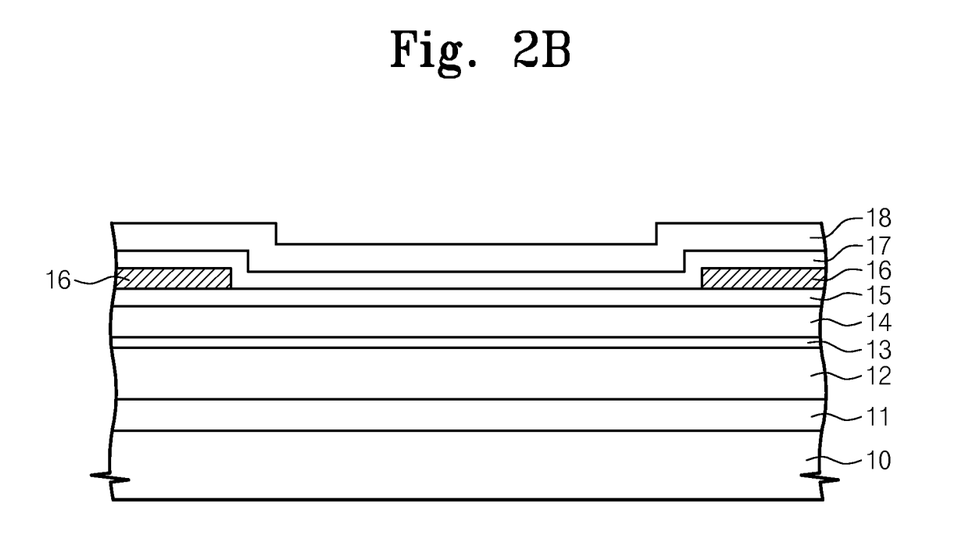

Referring to FIG. 2B, a second insulating layer 18 may be formed on the first insulating layer 17. The second insulating layer 18 may be formed of silicon nitride. In example embodiments, the second insulating layer 18 may be formed at a low temperature of about 100° C. using a plasma enhanced chemical vapor deposition (PECVD) and be formed to a thickness of about 2,000 Å.

Figure 2C:
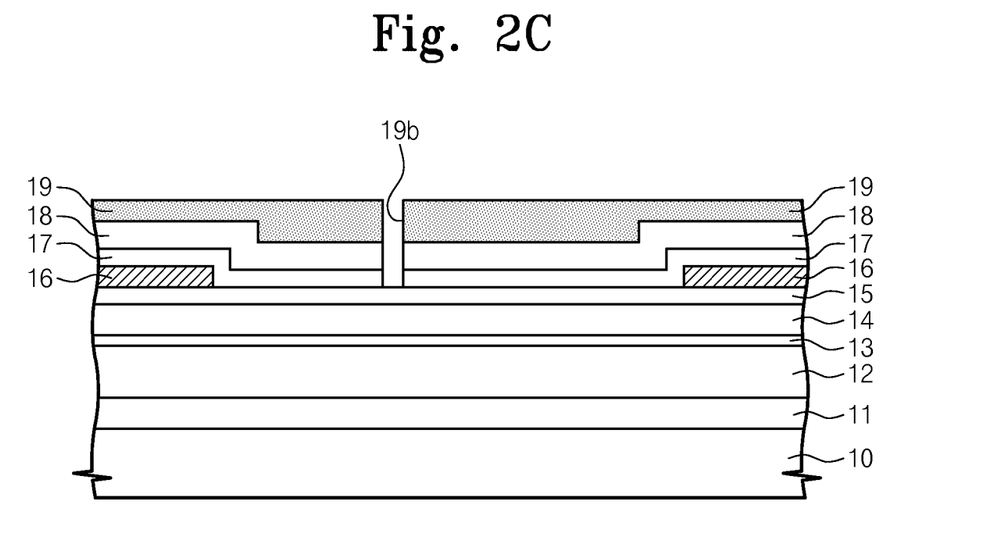

Referring to FIG. 2C, a photoresist layer 19 may be formed on the second insulating layer 18 to have a first opening 19b exposing the second insulating layer 18 between the source and drain ohmic electrodes 16. The photoresist layer 19 may include PolyMethyl MethAcrylate (PMMA).

A preliminary second opening may be formed in first and second insulating layers 17 and 18 to have substantially the same width as that of the first opening 19b. The formation of the preliminary second opening may include a step of partially etching the second and first insulating layers 18 and 17 using the photoresist layer 19 as an etch mask. In example embodiments, the partial etching of the second and first insulating layers 18 and 17 may be performed using an anisotropic dry etching process.

Figure 2D:
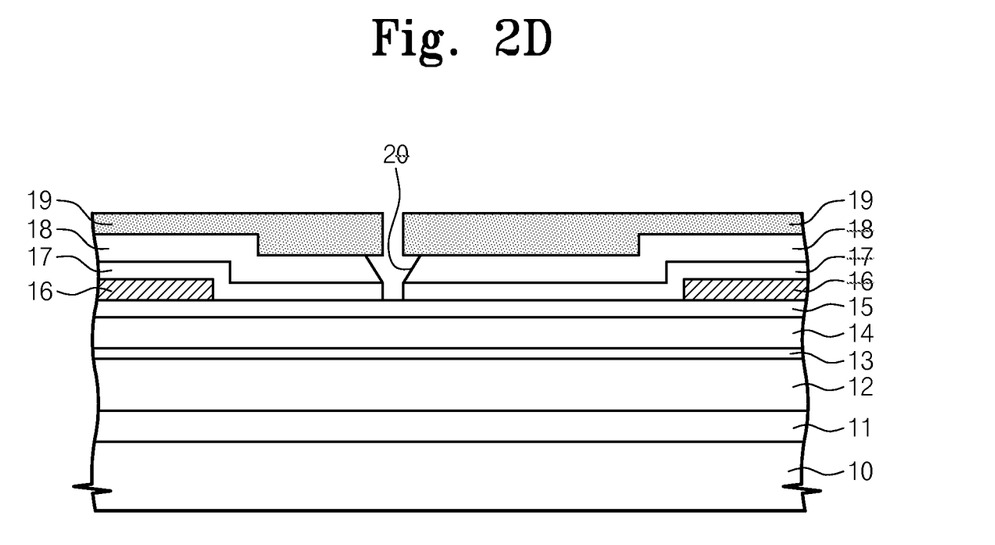

Referring to FIG. 2D, the second insulating layer 18 may be selectively etched to define a 'Y'-shaped second opening 20 in the first and second insulating layers 17 and 18. The formation of the second opening 20 may be performed using an isotropic plasma etching process, in which sulphur hexafluoride ($SF_6$) gas is used.

The photoresist layer 19 may be removed, after the formation of the second opening 20 in the first and second insulating layers 17 and 18.

Figure 2E:
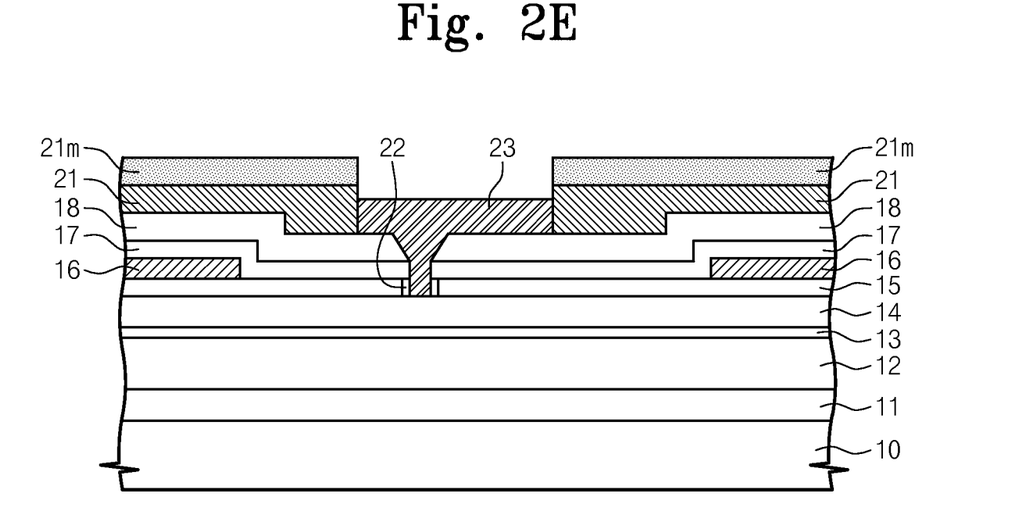

Referring to FIG. 2E, an etching process may be performed using the first and second insulating layers 17 and 18 with the second opening 20 as an etch mask to remove a portion of the capping layer 15, and thus, a third opening may be formed to expose a portion of the substrate. The third opening may be formed through the capping layer 15, the first insulating layer 17, and the second insulating layer 18. Further, the third opening may be formed to have an undercut region 22 defined by the capping layer 15. In example embodiments, the undercut region 22 may be formed to have a width greater than that of the first opening 19b. The formation of the undercut region 22 may include a step of etching a portion of the capping layer 15 exposed by the second opening 20 using a dry etching process, in which an inductively coupled plasma (ICP) technology is applied. The selective dry etching of the capping layer 15 may be performed using gas containing $BCl_3$ and/or $Cl_2$.

A photoresist mold layer 21 may be formed on the second insulating layer 18 to have a fourth opening, whose width is greater than those of the first opening 19b, the second opening 20, and the third opening. The fourth opening may be formed to have asymmetric widths with respect to the third opening. For example, in the fourth opening, a region toward the drain ohmic electrode 16 may be wider than other region toward the source ohmic electrode 16.

Conductive layers 21m and 23 may be formed in the third opening and fourth openings and on the photoresist mold layer 21. The conductive layers 21m and 23 may be formed of a heat-resisting metal. The conductive layers 21m and 23 may be formed of nickel/gold or platinum/nickel/tungsten nitride/gold. In example embodiments, the conductive layers 21m and 23 may be formed using an electron beam vacuum deposition process and thus cover the whole top surface of the resulting structure.

Except for the Γ-shaped gate electrode 23 provided in the third and fourth openings, the conductive layer 21m on the photoresist mold layer 21 may be removed by a lift-off process for removing the photoresist mold layer 21. In other words, the conductive layer 21m and the photoresist mold layer 21 may be simultaneously removed by the same lift-off process.

The Γ-shaped gate electrode 23 may include a leg portion, which penetrates the second insulating layer 18, the first insulating layer 17, and the capping layer 15 and is connected to a portion of the substrate between the source and drain ohmic electrodes 16, and a head portion extending to cover partially a top surface of the second insulating layer 18. The head portion may be a portion of the Γ-shaped gate electrode 23 extending horizontally and asymmetrically from the leg portion, and a length of the head portion extending toward the drain ohmic electrode 16 may be greater than that toward the source ohmic electrode 16. This is because the fourth opening has an asymmetric structure with respect to the third opening, as described above. The leg portion of the Γ-shaped gate electrode 23 may be shaped like a letter 'Y'. This is because the second opening 20 is shaped like the letter 'Y'.

The capping layer 15 may be formed to define the undercut region 22 that is provided adjacent to the leg portion of the Γ-shaped gate electrode 23. This is because if the conductive layers 21m and 23 are formed using the electron beam vacuum deposition process, the undercut region 22 may not be deposited with the conductive layer, owing to the second opening that is located thereon and has a smaller width than the undercut region 22.

Figure 2F:
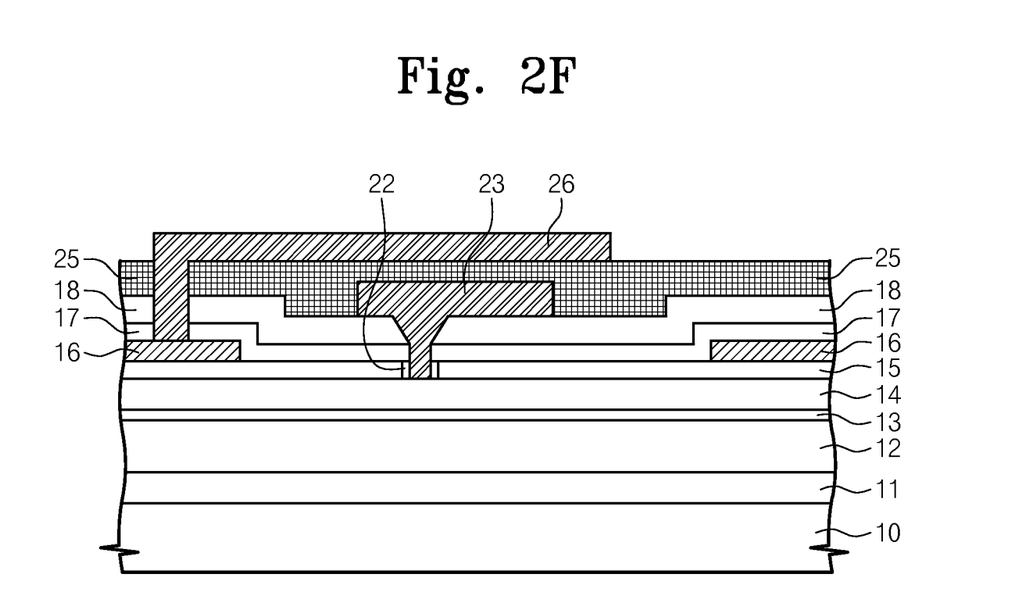

Referring to FIG. 2F, the conductive layer 21m on the photoresist mold layer 21, except for the Γ-shaped gate electrode 23 provided in the third and fourth openings, may be removed by a lift-off process for removing the photoresist mold layer 21.

A first planarization layer 25 may be formed on the second insulating layer 18 to cover the Γ-shaped gate electrode 23. The first planarization layer 25 may be formed of a low-k dielectric material, e.g., benzocyclobutene.

A first electrode 26 may be formed on the first planarization layer 25. The first electrode 26 may be connected to the source ohmic electrode 16 or the drain ohmic electrode 16 through the first planarization layer 25, the second insulating layer 18, and the first insulating layer 17. The first electrode 26 may be formed of a conductive material.

Figure 2G:
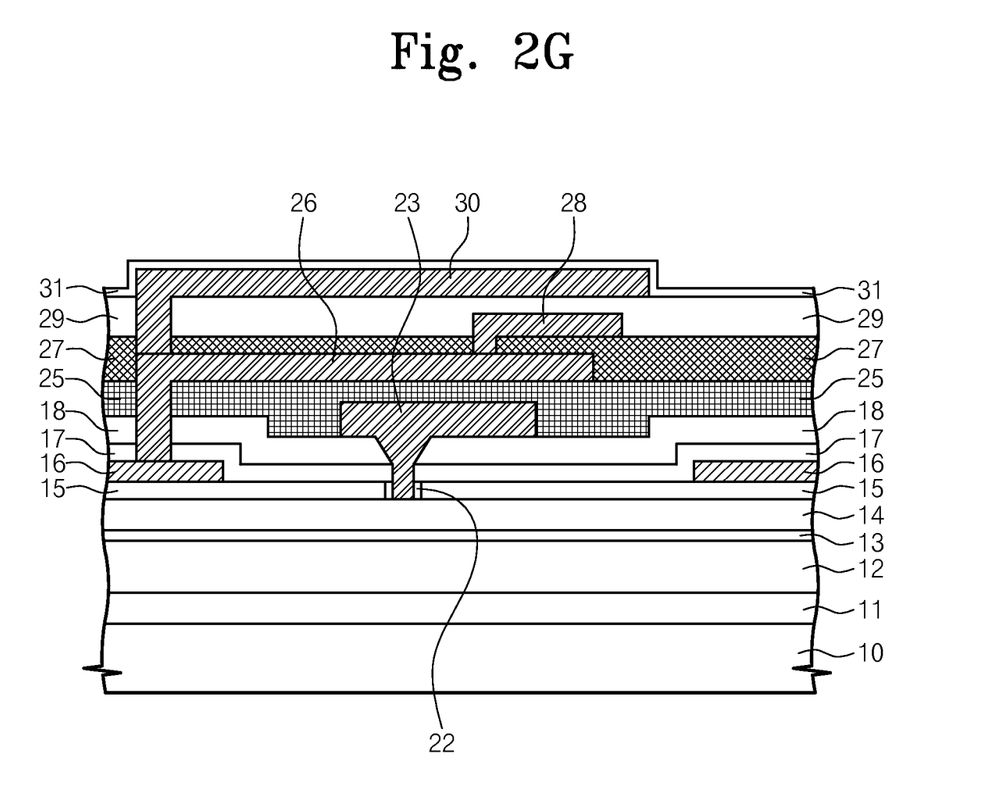

Referring to FIG. 2G, a second planarization layer 27 may be formed on the first planarization layer 25 to cover the first electrode 26. Thereafter, a second electrode 28 may be formed on the second planarization layer 27. The second electrode 28 may be connected to the first electrode 26 through the second planarization layer 27. A third planarization layer 29 may be formed on the second planarization layer 27 to cover the second electrode 28. A third electrode 30 may be formed on the third planarization layer 29. The third electrode 30 may be connected to the first electrode 26 through the third planarization layer 29 and the second planarization layer 27. Each of the second and third planarization layers 27 and 29 may be formed of a low-k dielectric material, e.g., benzocyclobutene. Each of the second and third electrodes 28 and 30 may be formed of a conductive material.

A protection layer 31 may be formed on the third planarization layer 29 to cover the third electrode 30. The protection layer 31 may be formed of silicon nitride.

According to example embodiments of the inventive concept, the Γ-shaped gate electrode of the field effect transistor may be formed by using an double-layered structure of insulating layers having different etch rates from each other, and thus, it is possible to improve stability of the Γ-shaped gate electrode and maintain a small width of the leg portion of the Γ-shaped gate electrode. Further, since the field effect transistor includes an insulating layer provided between the head portion of the Γ-shaped gate electrode and the substrate, it is possible to improve a drain output property and reduce parasitic capacitance between the Γ-shaped gate electrode and the source ohmic electrode and between the Γ-shaped gate electrode and the drain ohmic electrode. Furthermore, since the Γ-shaped gate electrode of the field effect transistor has a reduced length, it is possible to improve a cutoff frequency property and a high frequency property. As a result, it is possible to provide a method of fabricating a field effect transistor with improved stability, reduced parasitic capacitance, and high frequency property.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a field effect transistor, comprising:
    forming a capping layer on a substrate;
    forming a source ohmic electrode and a drain ohmic electrode on the capping layer to be spaced apart from each other;
    sequentially forming a first insulating layer and a second insulating layer on the capping layer to cover the source and drain electrodes;
    forming a photoresist layer with a first opening exposing a portion of the second insulating layer between the source and drain ohmic electrodes;
    partially etching the second and first insulating layers using the photoresist layer as an etch mask to define a second opening;
    removing the photoresist layer;
    partially etching the capping layer using the first and second insulating layers defining the second opening as an etch mask to form a third opening partially exposing the substrate;
    forming a Γ-shaped gate electrode with a leg portion connected to the substrate through the third opening and a head portion covering a top surface of the second insulating layer;
    forming a first planarization layer on the second insulating layer to cover the Γ-shaped gate electrode; and
    forming a first electrode on the first planarization layer, the first electrode being connected to the source ohmic electrode or the drain ohmic electrode through the first planarization layer, the second insulating layer, and the first insulating layer;
    wherein the defining of the second opening comprises:
    partially and anisotropically etching the second and first insulating layers using the photoresist layer as an etch mask to form a preliminary second opening having substantially the same width as the first opening; and
    selectively and isotropically etching the second insulating layer to define a Y-shaped second opening.

2. The method of claim 1, wherein the capping layer is formed of undoped gallium nitride.

3. The method of claim 1, wherein the first insulating layer is formed of alumina and the second insulating layer is formed of silicon nitride.

4. The method of claim 1, wherein the defining of the third opening comprises etching a portion of the capping layer using the first and second insulating layers with the second opening as an etch mask, and
    the capping layer is formed to define an undercut region, whose width is greater than that of the first opening.

5. The method of claim 4, wherein the leg portion of the Γ-shaped gate electrode is formed spaced apart from the capping layer, and thereby the third opening is not filled with the leg portion.

6. The method of claim 1, wherein the substrate is a stack of a silicon carbide substrate, an aluminum nitride buffer layer, an undoped gallium nitride channel layer, an undoped aluminum gallium nitride spacer layer, and an undoped aluminum gallium nitride Schottky layer that are sequentially stacked.

7. The method of claim 1, wherein the first planarization layer is formed of benzocyclobutene.

8. The method of claim 1, wherein the forming of the Γ-shaped gate electrode comprises:
    forming a photoresist mold layer on the second insulating layer to define a fourth opening, whose width is greater than those of the first to third openings;

forming conductive layers in the third and fourth openings and on the photoresist mold layer; and removing the photoresist mold layer and the conductive layer on the photoresist mold layer.

9. The method of claim 1, further comprising:

forming at least one second planarization layer on the first planarization layer to cover the first electrode; and forming a second electrode on the second planarization layer, the second electrode being connected to the first electrode through the second planarization layer.

10. The method of claim 9, further comprising, forming a protection layer on the second planarization layer to cover the second electrode.

11. The method of claim 1, wherein the Γ-shaped gate electrode has a Y-shaped portion between the head portion and the leg portion.

* * * * *